United States Patent [19]

Yamamoto et al.

[11] Patent Number: 4,477,553

[45] Date of Patent: Oct. 16, 1984

[54] PHOTOSENSITIVE COMPOSITIONS

[75] Inventors: Takeshi Yamamoto; Kiyoshi Goto; Masafumi Uehara, all of Hino, Japan

[73] Assignee: Konishiroku Photo Industry Co., Ltd., Tokyo, Japan

[21] Appl. No.: 566,778

[22] Filed: Dec. 29, 1983

Related U.S. Application Data

[63] Continuation of Ser. No. 329,035, Dec. 9, 1981, abandoned.

[30] Foreign Application Priority Data

Dec. 17, 1980 [JP] Japan .................................. 55-178618
Dec. 17, 1980 [JP] Japan .................................. 55-178619

[51] Int. Cl.$^3$ .......................... G03C 1/60; G03C 1/54; G03F 7/08
[52] U.S. Cl. .................................. 430/192; 430/190; 430/193; 430/191; 430/302
[58] Field of Search ............... 430/192, 193, 190, 326, 430/302

[56] References Cited

U.S. PATENT DOCUMENTS 3,635,709  1/1972  Kobayashi .......................... 430/302
3,647,443  3/1972  Rauner et al. ....................... 430/192
4,123,279 10/1978  Kobayashi .......................... 430/192
4,306,010 12/1981  Uehara et al. ....................... 430/190
4,308,368 12/1981  Kubo et al. ......................... 430/192

Primary Examiner—Charles L. Bowers
Attorney, Agent, or Firm—Frishauf, Holtz, Goodman & Woodward

[57] ABSTRACT

There is disclosed a photosensitive composition comprising an o-quinonediazide compound and, as a binder resin, a resin containing in the molecule the unit represented by the following formula

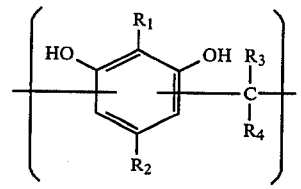

wherein $R_1$, $R_2$, $R_3$ and $R_4$ have the same meanings as defined in the specification.

The photosensitive composition according to the present invention has excellent resistance to chemicals and long press-life, and is excellent in alkali-solubility and difficult to form scumming.

22 Claims, No Drawings

PHOTOSENSITIVE COMPOSITIONS

This application is a continuation of application Ser. No. 329,035, filed Dec. 9, 1981, now abandoned.

This invention relates to a photosensitive composition, especially for lithographic printing plates, containing certain o-quinonediazide compounds as a photosensitive component.

It is known that an o-quinonediazide compound, when irradiated by active ray, can be decomposed into a 5-membered cyclic carboxylic acid, which can be soluble in an alkaline solution. Therefore, a photosensitive composition containing the o-quinonediazide compound has been widely employed for a photosensitive lithographic printing plate, a photoresist and the like as the photosensitive composition capable of producing a positive-positive type image.

When such o-quinoneazide compounds are employed alone as a photosensitive composition without binder, not only crystals tend to be separated out in situ, but the produced image has a weak mechanical strength and it is difficult to print many copies. The o-quinonediazide compounds have been, therefore, used in admixture with an alkali-soluble resin as a binder.

As the alkali-soluble resin, there have been hitherto employed frequently phenol-formaldehyde resins, cresol-formaldehyde resins, resorcinol-formaldehyde resins and so on. Also, it is disclosed in Japanese Patent Laid Open Application No. 125806/1980 those condensates of $C_3$–$C_8$ alkyl-substituted phenols or cresols with formaldehyde.

However, in case where prior art photosensitive compositions containing the said alkali-soluble resin and o-quinoneazide compound is applied to a lithographic printing plate, there are seen such drawbacks that printing image are susceptible to being attacked by various chemicals employed for removal of scumming during printing operation or for gumming-up or by damping water containing alcohols during printing thereby printing of many copies being impracticable. If treated with an exhausted developer employed for a prolonged period of development, scumming is apt to be produced during printing.

It is, accordingly, a primary object of this invention to provide a photosensitive composition having excellent resistance to chemicals and long press-life. Another object of this invention is to provide a photosensitive composition which is excellent in alkali-solubility and difficult to form scumming.

The present invention have made extensive studies in order to accomplish the above-mentioned purposes and now completed the present invention, the subject matter of which resides in a photosensitive composition containing an o-quinonediazide compound characterized by including, as a binder resin, a resin having in its molecule the unit represented by the following general formula:

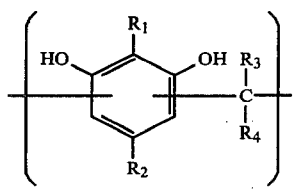

wherein $R_1$ represents a hydrogen atom, a hydroxyl group or an alkyl group having 1 to 8 carbon atoms; $R_2$ represents a hydrogen atom, a halogen atom, an alkyl group having 1 to 4 carbon atoms or an alkoxy group having 1 to 4 carbon atoms; $R_3$ represents a hydrogen atom or an alkyl group having 1 to 4 carbon atoms, an aryl group or a substituted aryl group; and $R_4$ represents a phenyl group which may be unsubstituted or substituted with a halogen atom, an alkyl group, an alkoxy group or a nitro group when $R_1$ is a hydrogen atom or a hydroxyl group, or $R_4$ represents a hydrogen atom, a lower alkyl group having 1 to 4 carbon atoms, an aryl group or a substituted aryl group when $R_1$ is an alkyl group having 1 to 8 carbon atoms.

In the binder resin having the unit represented by the above general formula, the said unit may preferably comprise 20% by weight and more preferably not less than 40% by weight.

In the above-defined general formula, the alkyl group represented by $R_1$ may preferably be an alkyl group having 1 to 4 carbon atoms such as methyl and ethyl; the alkyl group represented by $R_2$ may preferably be methyl; the aryl group represented by $R_3$ may preferably be a phenyl group and the substituted aryl group represented by $R_3$ may preferably be a phenyl group substituted preferably with an alkyl group having 1 to 4 carbon atoms. The alkyl group or the alkoxy group which is a substituent on the phenyl group represented by $R_4$ (when $R_1$ is a hydrogen atom or a hydroxyl group) may preferably have 1 to 4 carbon atoms, and the aryl group and the substituted aryl group represented by $R_4$ (when $R_1$ is an alkyl group) may preferably be a phenyl group and a phenyl group having as a preferable substituent an alkyl group having 1 to 4 carbon atoms or an alkoxy group having 1 to 4 carbon atoms, respectively.

The polyphenol which may be employed for the synthesis of the present binder resin may include, for example, resorcinol, 2-methylresorcinol, 2-ethylresorcinol, 2-propylresorcinol, 2-isopropylresorcinol, 2-t-butyl-resorcinol, 2-pentylresorcinol, 2-hexylresorcinol, 2-octylresorcinol, 2-methyl-5-chlororesorcinol, 2-ethyl-5-chlororesorcinol, 2,5-dimethyl-resorcinol, 2-methyl-5-ethylresorcin, 2-methyl-5-methoxyresorcinol, 2,5-diethylresorcinol, 2-t-butyl-5-methylresorcinol, 5-chlororesorcinol, 5-methoxyresorcinol, 5-methylresorcinol, 5-ethylresorcinol, 5-t-butylresorcinol, pyrogallol, 5-chloropyrogallol, 5-methoxypyrogallol, 5-methylpyrogallol, 5-ethylpyrogallol, 5-t-butylpyrogallol and the like. Above all, resorcinol, 2-methylresorcin, 2-ethylresorcinol and 5-methylresorcinol are particularly preferable.

The aldehydes or ketones which may be employed for the synthesis of the present binder resin may include, for example, formaldehyde, acetaldehyde, benzaldehyde, acetone, methyl ethyl ketone, diethyl ketone, acetophenone, 4-methylbenzaldehyde, 4-ethylbenzaldehyde, 4-t-butylbenzaldehyde, 4-methylacetophenone, benzophenone, 4-methylbenzophenone, 4,4'-dimethylbenzophenone p-chlorobenzaldehyde, m-methoxybenzaldehyde, p-nitrobenzaldehyde and the like. Above all, acetaldehyde and acetone are particularly preferable when $R_1$ represents an alkyl group, and benzaldehyde and 4-methylbenzaldehyde are particularly preferable when $R_1$ represents a hydrogen atom or a hydroxyl group.

Moreover, these polyhydric phenols and aldehydes or ketones may be optionally combined mutually. Co-condensation polymerization with phenol, p-substituted phenol such as p-cresol, m-cresol and the like may also feasible and, in this instance, the molar ratio of the unit represented by the above general formula to be incorporated is suitably not less than 20 mole % based upon the total composition, preferably not less than 40 mole %. It is also feasible to employ two or more of the resins having the unit represented by the above general formula in admixture therewith.

A synthesis of the resin having the unit represented by the above general formula which may be employed in this invention is disclosed in Japanese Patent Laid Open Applications No. 1044/1981 and No. 1045/1981. More specifically, the polyhydric phenol and aldehyde or ketone as such or in the form of a solution thereof in an organic solvent such as alcohol may be condensed in the presence of an acid, e.g. hydrochloric acid or oxalic acid or an alkali, e.g. sodium hydroxide or aqueous ammonia, usually in an amount of the aldehyde or ketone employed which is in the range of 0.85 to 1.0 mole part per mole part of the polyhydric phenol, to yield the desired resin. In this condensation, the molar ratio of each monomeric material incorporated and condensation condition may be widely varied to obtain any molecular weight of the desired resin. However, the resin having a molecular weight ranging from about 600 to about 10,000 may be usually and effectively employed in this invention for the purposes intended in this invention, with a molecular weight of about 800 to 4,000 being particularly preferable.

Representative synthesis examples of the resin which may be employed for the present invention are shown below.

SYNTHESIS EXAMPLE B 1

(2-Methylresorcinol-acetaldehyde resin)

To a solution of 621 g. of 2-methylresorcinol in 1 l. of ethanol were added 209 g. of acetaldehyde and 0.5 ml. of 35% conc. hydrochloric acid as a catalyst. The resulting mixture was heated with stirring in an oil bath and, when the reaction mixture began to boil under reflux through exothermic reaction, heating was reduced and then heating under reflux was continued as it was for further 90 minutes. After completion of the reaction, the reaction mixture was poured into 5 l. of a cold water with stirring to give a pale brown powdery resin.

Yield 637 g., molecular weight, about 2100.

SYNTHESIS EXAMPLE 2

(2-Methylresorcinol-acetone resin)

To a solution of 621 g. of 2-methylresorcinol in 1 l. of acetone were added 30 g. of phosphorus oxychloride as a catalyst and the resulting mixture was stirred at room temperature for 24 hours. After completion of the reaction, the reaction mixture was poured into 10 l. of a cold water to give a pale brown powdery resin.

Yield 656 g., molecular weight about 2000.

SYNTHESIS EXAMPLE 3

(2-Ethylresorcinol-benzaldehyde resin)

To a solution of 629 g. of 2-ethylresorcinol in 1 l. of dioxane were added 530 g. of benzaldehyde and 30 g. of phosphorus oxychloride as a catalyst. The resulting mixture was stirred at room temperature for 24 hours and thereafter poured into 5 l. of a cold water with stirring to give a pale brown powdery resin.

Yield, 1073 g., molecular weight, about 1800.

SYNTHESIS EXAMPLE 4

(2,5-Dimethylresorcinol-formaldehyde resin)

To a solution of 691 g. of 2,5-dimethylresorcinol in 1 l. of ethanol were added 348 g. of a 37% aqueous solution of formaldehyde and 0.5 ml. of 35% conc. hydrochloric acid as a catalyst. The resulting mixture was heated in the same manner as in the Synthesis example 1 and poured into 5 l. of a cold water to give a pale brown powdery resin.

Yield, 683 g., molecular weight, about 1500.

SYNTHESIS EXAMPLE 5

(Resorcinol-benzaldehyde resin)

To a solution of 550 g. of resorcinol in 1 l. of ethanol were added 530 g. of benzaldehyde and 0.5 ml. of 35% conc. hydrochloric acid as a catalyst. The resulting mixture was heated under reflux for 90 minutes with stirring and, after completion of the reaction, the reaction mixture was poured into 5 l. of a cold water to give a pale brown powdery resin.

Yield, 945 g., molecular weight, about 1400.

SYNTHESIS EXAMPLE 6

(5-Methylresorcinol-benzaldehyde resin)

To a solution of 621 g. of 5-methylresorcinol in 1 l. of dioxane were added 530 g. of benzaldehyde and 30 g. of phosphorus oxychloride as a catalyst. The resulting mixture was reacted at room temperature for 24 hours and then poured into 5 l. of a cold water. There was obtained a pale brown powdery resin.

Yield, 986 g., molecular weight, about 1700.

SYNTHESIS EXAMPLE 7

(Resorcinol-acetophenone resin)

To a solution of 550 g. of resorcinol in 1 l. of dioxane were added 600 g. of acetophenone and 0.5 ml. of 35% conc. hydrochloric acid as a catalyst. The resulting mixture was heated with stirring for 3 hours and then poured into 5 l. of a cold water to give a pale brown powdery resin.

Yield, 671 g., molecular weight, about 2100.

SYNTHESIS EXAMPLE 8

(Pyragallol-benzaldehyde resin)

To a solution of 630 g. of pyrogallol in 1 l. of ethanol were added 530 g. of benzaldehyde and 30 g. of phosphorus oxychloride as a catalyst. The resulting mixture was stirred at room temperature for 24 hours and then poured into 5 l. of a cold water. There was obtained a reddish brown powdery resin.

Yield, 765 g., molecular weight, about 1600.

SYNTHESIS EXAMPLE 9

(Co-condensation resin of 2-methylresorcinol, phenol and acetaldehyde)

To a solution of 372 g. of 2-methylresorcinol and 188 g. of phenol in 1 l. of ethanol were added 209 g. of acetaldehyde and 0.5 ml. of 35% conc. hydrochloric acid as a catalyst. The resulting mixture was heated with stirring in an oil bath under reflux. After 90 minutes reaction, it was poured into 5 l. of cold water to give a pale brown powdery resin.

Yield, 590 g., molecular weight, about 2000.

SYNTHESIS EXAMPLE 10

(Co-condensation resin of resorcinol, phenol and benzaldehyde)

To a solution of 330 g. of resorcinol and 188 g. of phenol in 1 l. of ethanol were added 530 g. of benzaldehyde and 0.5 ml. of 35% conc. hydrochloric acid as a catalyst. The resulting mixture was heated with stirring under reflux for 2 hours and then poured into 5 l. of a cold water to give a pale brown powdery resin.

Yield, 900 g., molecular weight, about 1500.

The above-recited molecular weights are all weight average ones.

Further, other resins can be synthesized in the same manner as in the foregoing Synthesis Examples.

In the case where the present resin is to be employed in admixture with the o-quinonediazide compound, a content of the resin, based upon the total solid of the photosensitive composition, is desirably in the range of about 1 to 80% by weight, more preferably 5 to 50% by weight. As the o-quinonediazide compound which may be applied as a photosensitive component in this invention, there may be useful esters or amides of the sulfonic acid chloride of o-quinonediazide such as o-benzoquinonediazide, and o-naphthoquinonediazide with aromatic mono- or poly-hydroxyl compounds or polyamino compounds. Representative examples thereof may include esters of benzoquinone-1,2-diazidesulfonyl chloride or naphthoquinone-1,2-diazidesulfonyl chloride with a phenol-formaldehyde resin or a cresol-formaldehyde resin; esters of naphthoquinone-1,2-diazidesulfonyl chloride with a pyrogallol-acetone resin, and the like. Other useful o-quinonediazide compounds may include the reaction product of a polyester having hydroxy terminal groups esterified with o-naphthoquinonediazidesulfonic acid as disclosed in Japanese Laid Open Patent Application Specification No. 117503/1975; the reaction product of a homopolymer of p-hydroxystyrene or a copolymer thereof with other copolymerizable monomer esterified with o-naphthoquinonediazidesulfonic acid as disclosed in Japanese Laid Open Patent Application Specification No. 113305/1975; the ester of a bisphenol-formaldehyde resin with o-quinonediazidesulfonyl chloride as disclosed in Japanese Patent Published Application Specification No. 29922/1979; the condensate of a polymer amine with an o-quinonediazide acid halide as disclosed in Japanese Patent Laid Open Application Specification No. 96575/1973; the reaction product of a polymerization product of a styrene monomer with a phenol derivative with o-quinoneazidesulfonic acid as disclosed in Japanese Patent Published Application Specification No. 17481/1974; and the ester of a polyhydroxybenzophenone with o-naphthoquinonediazidesulfonic acid chloride; the co-condensation product of resorcin, pyrogallol and acetone with o-naphthoquinonediazidesulfonyl chloride as disclosed in Japanese Patent Laid Open Application No. 76346/1980; the condensation product of a phenol resin with o-naphthoquinonediazidesulfonyl chloride as disclosed in Japanese Patent Applications No. 76216/1979 and No. 76217/1979. The o-quinonediazide compound is preferably incorporated into the photosensitive composition at 10-50% by weight, upon the total solid thereof.

The photosensitive composition of this invention may further comprise a wide variety of additives, if required. For instance, there may be added for improved ink receptivity a lipophilic phenolformaldehyde resin, a p-substituted phenol-formaldehyde resin or a photosensitive resin obtained by condensation thereof with o-quinonediazidesulfonic acid chloride as disclosed in Japanese Patent Published Application No. 5083/1975, Japanese Patent Laid Open Applications No. 36206/1975 and No. 125806/1975 or British Pat. No. 1,329,886. Moreover the photosensitive composition of the present invention may further comprise a condensed resin or a copolymerized-condensed resin of phenols with aliphatic aldehydes or aliphatic ketones as a binder such as a phenol-formaldehyde resin, a cresol-formaldehyde resin, a co-condensation product of phenol, cresol, and formaldehyde. The ratio of other binder resin relative to the resin according to this invention is 1/20-10/1.

Also, as the additive for improving coating properties, there may be added cellulosealkyl ethers, ethylene oxide type surface active agents, fluorine-containing surface active agents and the like. Further, there may be added a plasticizer in order to improve flexibility of a coated film: for example, there may be useful and effective phthalic acid esters such as dibutyl phthalate or dioctyl phthalate; glycol esters such as butyl glycolate or ethyl phthalylethylglycolate; phosphoric acid esters such as triphenyl phosphate or tricresyl phosphate; aliphatic dibasic acid esters such as dioctyl adipate; and the like.

Moreover, there may be added an acid-producing agent and an organic dye being capable of reacting with acid and changing in its tone in order to form a visible image. The acid-producing agent may include, for example, the o-naphthoquinonediazide-4-sulfonic acid halogenides as disclosed in Japanese Patent Laid Open Application Specification No. 36209/1975; the trihalomethyl-2-pyrones or trihalomethyltriazines as disclosed in Japanese Patent Laid Open Application Specification No. 36223/1978; the esterified product of o-naphthoquinonediazide-4-sulfonic acid chloride with phenols or anilines having electron-attractive substituents as disclosed in Japanese Patent Laid Open Application Specification No. 6244/1980; the halomethyl-vinyloxadiazole compounds as disclosed in Japanese Patent Laid Open Application No. 77742/1980 and the like. Also, diazonium salts may be added. The organic dye may include, for example, Victoria Pure Blue BOH (manufactured by Hodogaya Chemical Co., Ltd., Japan), Patent Pure Blue (manufactured by Sumitomo Mikuni Chemical Co., Ltd., Japan), Oil Blue #603 (manufactured by Orient Kagakukogyo K.K., Japan), Sudan Blue II (manufactured by BASF, West Germany), Crystal Violet, Malachite Green, Fuchsine, Methyl Violet, Ethyl Violet, Methyl Orange, Brilliant Green, Congo Red, Eosine, Rhodamine 6G and the like.

Moreover, the silane coupling agent, e.g. aminoalkoxysilane compounds as disclosed in Japanese Patent Laid Open Application Specification No. 52002/1976 may be added in order to improve adhesion between a photosensitive layer and a support. And further, there may be added a cyclic acid anhydride in order to increase sensitivity and developing ability. The present composition may be coated over a support in the form of a solution of the said components in a solvent capable of dissolving them. As the solvent which may be employed, there may be mentioned methyl cellusolve, ethyl cellosolve, methyl cellosolve acetate, ethyl cellosolve acetate, cyclohexane, methyl ethyl ketone, toluene, ethyl acetate, dimethylformamide, dimethyl sulfoxide, ethylene dichloride and the like and they may be used alone or in admixture therewith.

A concentration of the solid in a coating solution is suitably of 2–50% by weight. An amount to be coated is generally and suitably 0.5–3.0 g/m² in terms of the solid in case of a photosensitive lithographic printing plate. For coating, there may be employable any of well-known methods, such as dip coating, air-knife coating, head coating, curtain coating and the like.

As the support over which the photosensitive composition of this invention is to be coated, one may optionally select depending upon the intended use aluminum plate, zinc plate, copper plate, plastic film, paper, chromium deposited plastic film, aluminum alloy, stainless steel plate or the like.

The photosensitive lithographic printing plate comprising the support provided with the present photosensitive composition can be subjected to exposure through a transparent positive film to light from such light sources as a carbon-arc lamp, mercury vapor lamp, xenon lamp or tungsten lamp and then to development with an alkaline aqueous solution to leave only the unexposed portion over the support surface, thereby forming a relief image of the positive-positive type, as the illustrative examples of the alkaline aqueous solution which may be employed for development, there may be mentioned aqueous solutions of, for example, sodium hydroxide, potassium hydroxide, calcium hydroxide, sodium carbonate, potassium carbonate, sodium metaborate, sodium tertiary phosphate, sodium secondary phosphate, sodium metasilicate, sodium formate and the like. Also, a surface active agent, an organic solvent such as an alcohol and the like may be incorporated into the developing solution, if necessary.

The lithographic printing plate containing the resin according to this invention in a photosensitive layer shows a remarkably superior developing ability and has been found to be satisfactorily employed at a ½ to even ¼ alkali concentration in the developing solution, as compared with the lithographic printing plate containing the cresol-formaldehyde resin practised hitherto. Moreover, the so produced image has a very superior chemical resistance and also a good ink respectively so that there may be effected the printing of many sheets. They appear to be probably attributed to properties of the resin of this invention itself: A superior developing ability may be attributable to the presence of many unreacted hydroxyl groups therein.

This invention will be more concretely illustrated by way of the following examples. However, embodiments of this invention are not intended to be limited thereto.

EXAMPLE 1

An aluminum plate with a thickness of 0.24 mm was electrochemically grained, anodized and sealed with hot water and then a photosensitive composition having the following formulation and being dissolved in 100 g. of Ethyl cellosolve was coated thereon by means of whirl-coating.

| | |
|---|---|
| Ester of naphthoquinone-1,2-diazide-5-sulfonyl chloride with 2-methylresorcinol-acetaldehyde resin (30 mole % condensation) as a photosensitive compound | 3.5 g. |
| 2-Methylresorcinol-acetaldehyde resin (Synthesis example 1) | 4.5 g. |
| m-Cresol-formaldehyde resin (manufactured by Gunei Kagaku K.K., Japan, MP-707) | 4.5 g. |
| Naphthoquinone-1,2-diazide-4-sulfonyl chloride | 0.15 g. |
| Ester of naphthoquinone-1,2-diazide-5-sulfonyl chloride with p-butylphenol-formaldehyde resin (50 mole % condensation) | 0.15 g. |
| Victoria Pure Blue BOH (manufactured by Hodogaya Chemical Co., Ltd., Japan) | 0.2 g. |

The coating weight after drying was about 2.5 g./m². A positive transparent original was contacted onto the photosensitive lithographic printing plate prepared in this way [Sample (1)] and exposure was made for 70 seconds with a metal halide lamp as a light source. Radiation illumination at this point was 8.0 mW/cm².

Thereafter, development was effected with a 1% aqueous solution of sodium metasilicate (nonahydrate) under the condition of 25° C. for 25 seconds to cause the exposed portion thereof to rapidly dissolve, thereby producing an offset printing plate having excellent ink receptivity and resistance to chemicals. This printing plate was used for printing in an offset press to produce many printed copies with a good ink receptivity and a clear image.

COMPARATIVE EXAMPLE 1

A photosensitive lithographic printing plate [Comparative Sample (1)] was prepared by coating in the same manner as described in the above Example 1 by coating a photosensitive composition having the same formulation as that described in the above Example 1 except that m-cresol-formaldehyde resin (manufactured by Gunei Kagaku K.K., MP-707) was employed as a binder instead of the 2-methylresorcinolacetaldehyde resin.

Then, the photosensitive plate was exposed under the same condition as above and similarly subjected to development with a 1% aqueous solution of sodium metasilicate to produce incomplete dissolution of the exposed portion thereof. A concentration of the aqueous sodium metasilicate solution was gradually raised and 3% was the concentration at which complete development was accomplished under the same condition as in the above Example 1. Moreover, when development was done in the same manner as stated above with the developing solution, which had been previously developed 4 octavo sheets/l. of a commercially available photosensitive lighographic printing plate (corresponding to an approximately 1% aqueous solution of sodium metasilicate), the exposed portion thereof was completely dissolved in case of the polyhydroxyphenyl type plate in the Example 1. However, when similarly developed with the similar exhausted developer (3% aqueous solution of sodium metasilicate), the exposed portion thereof was not completely dissolved in case of the plate of m-cresol-formaldehyde resin solely used. Thereafter, the above two printing plates were compared for chemical resistance. Where dipped in a 50% aqueous solution of isopropyl alcohol generally employed for a damping arrangement at room temperature over 60 minutes, loss of the printing area in the printing plate of the above Comparative Sample (1) was 55% by weight, whereas loss of the printing area in the printing plate of the above Sample (1) was 15% by weight. Further, where the above-mentioned two printing plates were dipped in an ultra plate cleaner (manufactured by A.B.C. Chemical Co., Ltd.) as a treating chemical at room temperature over 60 minutes, the printing plate of the Comparative Sample (1) had the printing area dissolved to the extent that grain in the aluminum surface may be observed, whereas the printing plate of Sample (1) showed no exposed aluminum surface. Where these two printing plates were used for printing in an offset press, the comparative printing plate Comparative Sample (1) had only ¾ press life, as compared with that of the Sample (1).

EXAMPLE 2

An aluminum plate with the thickness of 0.24 mm was subjected to graining by a nylon brush and anodized and then a photosensitive composition having the following formulation and being dissolved in 100 g. of Ethyl cellosolve was coated thereon by means of whirl-coating.

| | |
|---|---|
| Ester of naphthoquinone-1,2-diazide-5-sulfonyl chloride with m-cresol-formaldehyde resin (25 mole % condensation) as a photosensitive compound | 3.5 g. |
| 2-Methylresorcinol-acetone resin (the Synthesis Example 2) | 6 g. |
| Co-condensation resin of phenol, m- and p-cresol mixture and formaldehyde [Molar ratio of phenol to cresols = 4:6, weight average molecular weight (hereinafter referred to as "molecular weight") = 1500] | 3 g. |
| Ester of naphthoquinone-1,2-diazide 5-sulfonyl chloride with p-octyl-phenol-formaldehyde resin (50 mole % condensation) | 0.15 g. |
| Naphthoquinone-1,2-diazide-4-sulfonyl chloride | 0.15 g. |
| Oil Blue #603 (manufactured by Orient Kagaku Kogyo K.K.) | 0.2 g. |

The coating weight after drying was about 2.8 g./m². The photosensitive lithographic printing plate prepared in this way [Sample (2)] was exposed in the same manner as in the Example 1. Then, the photosensitive plate was developed with a 2% aqueous solution of sodium metasilicate to produce an offset printing plate. Moreover, the above printing plate was tested for chemical resistance under the same condition as in the Comparative Example 1. After dipping in a 50% aqueous solution of isopropyl alcohol, loss of the printing area was 20% by weight. Even after dipping in an ultra plate cleaner (manufactured by A.B.C. Chemical Co., Ltd.), there was obsered no exposed aluminum surface. In contrast thereto, when a photosensitive lithographic printing plate [Comparative Sample (2)] was compared having the same composition as defined above except that only a co-condensation resin of phenol, m- and p-cresol mixture and formaldehyde (molar ratio of phenol to cresols=4:6, molecular weight=1500) was included as a binder, development could not be effected until the concentration of the aqueous sodium metasilicate solution was raised to 4%. Further, the photosensitive plate [Sample (2)] according to the Example 2 showed the exposed portion dissolved even if the developer concentration was diluted 3 times (a 0.7% aqueous solution of sodium metasilicate), whereas the co-condensation resin type photosensitive plate [Comparative Sample (2)] could not be developed with a 3-times diluted developing solution (a 1.4% aqueous solution of sodium metasilicate). Also, loss in a 50% aqueous solution of isopropyl alcohol was 50%, the printing area was dissolved with an ultra plate cleaner (manufactured by A.B.C. Chemical Co., Ltd.) and approximately half of the aluminum surface was exposed. Press life of Comparative Sample (2) thereof was ¾ of Sample (2).

EXAMPLE 3

The same aluminum plate as in the above Example 1 was coated with a photosensitive composition having the following formulation and being dissolved in 50 g. of Ethyl cellosolve and 50 g. of Dimethylformamide by means of whirl-coating.

| | |
|---|---|
| Ester of naphthoquinone-1,2-diazide-5-sulfonyl chloride with pyrogallol-acetone resin (50% condensation) as a photosensitive compound | 3.5 g. |
| 2-Ethylresorcinol-benzaldehyde resin (the Synthesis Example 3) | 4.5 g. |
| m-Cresol-formaldehyde resin (manufactured by Gunei Kagaku K.K., MP-707) | 4.5 g. |
| Ester of naphthoquinone-1,2-diazide-5-sulfonyl chloride with p-octylphenol-formaldehyde resin | 0.15 g. |
| Naphthoquinone-1,2-diazide-4-sulfonyl chloride | 0.15 g. |
| Crystal Violet | 0.2 g. |
| Ethyl cellosolve | 50 g. |
| Dimethylformamide | 50 g. |

The coating weight after drying was about 2.5 g./m². The photosensitive lithographic printing plate prepared in this way [Sample (3)] was exposed in the same manner as in the above Example 1. Then, when developed with a 2% aqueous solution of sodium metasilicate and the corresponding 0.7% solution, respectively, the exposed portion was completely dissolved in every case. Moreover, loss of the printing area with a 50% aqueous solution of isopropyl alcohol was 15% and no exposed aluminum surface was observed even after dipping in an ultra plate cleaner. In contrast thereto, comparision was made with a photosensitive lithographic printing plate [Comparative Sample (3)] having the same composition as defined above except that only a phenol-formaldehyde resin was included as a binder. The latter plate could not be developed with the same low alkali content developing solution as stated above, loss of the image portion with a 50% aqueous solution of isopropyl alcohol was 40% by weight and the printing area was dissolved with an ultra plate cleaner (manufactured by A.B.C. Chemical Co., Ltd.) which exposed the aluminum surface. Press life of Comparative Sample (4) was ⅔ of the above Sample (3).

Moreover, a second comparision was made with a photosensitive lithographic printing plate having the same composition as defined above except that only m-Cresol-formaldehyde resin was included as a binder. This plate [Comparative Sample (4)] could not be developed with the same alkali content developing solution as stated above after exposure, loss of the printing area with a 50% aqueous solution of isopropyl alcohol was 50% and the printing area was dissolved with the said ultra plate cleaner which also exposed the aluminum surface. And press life of Comparative Sample (4) was 3/5 of Sample (3).

EXAMPLE 4

The same aluminum plate as in the above Example 1 was coated with a photosensitive composition having the following formulation and being dissolved in 100 g. of Methyl cellosolve was coated thereon by means of whirl-coating.

| | |
|---|---|
| Ester of naphthoquinone-1,2-diazide-5-sulfonyl chloride with m-cresol-formaldehyde resin (Gunei Kagaku K.K., MP-707) (25 mole % condensation) as a photosensitive compound | 3.5 g. |
| 2,5-Dimethylresorcinol-formaldehyde resin (the Synthesis Example 4) | 6 g. |
| m- and p-cresols mixture-formaldehyde resin (molecular weight 1500) | 3 g. |
| Ester of naphthoquinone-1,2-diazide-5-sulfonyl chloride with p-octylphenol formaldehyde resin (50 mole % condensation) | 0.15 g. |
| Naphthoquinone-1,2-diazide-4-sulfonyl chloride | 0.15 g. |
| Patent Pure Blue (manufactured by Sumitomo Mikuni Chemical Co., Ltd.) | 0.2 g. |

The photosensitive lithographic printing plate prepared in this way [Sample (4)] was subjected to the same development test and chemical resistance test as in the above Example 2 to give favourable results in which the printing area was hardly dissolved with respect to chemical resistance and the exposed portion was completely dissolved away with respect to development.

EXAMPLE 5

An aluminum plate with a thickness of 0.24 mm was electrochemically grained, anodized and sealed with hot water and then a photosensitive composition having the following formulation and being dissolved in Methyl cellosolve was coated thereon by means of whirl-coating.

| | |
|---|---|
| Ester of naphthoquinone-1,2-diazide-5-sulfonyl chloride with resorcinol-benzaldehyde resin (25 mole % condensation) as a photosensitive compound | 3.5 g. |
| Resorcinol-benzaldehyde resin (the Synthesis Example 5) | 3 g. |
| Co-condensation resin of phenol, m- and p-cresols mixture and formaldehyde (molar ratio of phenol to cresols = 2:8, molecular weight = 1400) | 6 g. |
| Ester of naphthoquinone-1,2-diazide-5-sulfonyl chloride with p-butylphenol-formaldehyde resin (50 mole % condensation) | 0.15 g. |
| Naphthoquinone-1,2-diazide-4-sulfonyl chloride | 0.15 g. |
| Victoria Pure Blue BOH (manufactured by Hodogaya Chemical Co., Ltd.) | 0.2 g. |

The coating weight after drying was about 2.6 g./m$^2$. A positive transparent original was contacted onto the so produced photosensitive lithographic printing plate [Sample (5)] and exposure was made for 70 seconds with a metal halide lamp as a light source. Radiation illumination at this point was 8.0 mW/cm$^2$.

Thereafter, development was effected with a 1% aqueous solution of sodium metasilicate (nonahydrate) under the condition of 25° C. for 45 seconds to cause the exposed portion thereof to rapidly dissolve, thereby producing an offset printing plate having excellent ink receptivity and chemical resistance. This printing plate was used for printing in an offset press to produce many printed copies with a good ink receptivity and a favourable image quality.

COMPARATIVE EXAMPLE 2

A photosensitive lithographic printing plate [Comparative Sample (5)] was prepared by coating in the same manner as in the above Example 5 with the coating solution having the same formulation as in the above Example 5 except that m-cresol-formaldehyde resin (manufactured by Gunei Kagaku K.K., MP-707) was included therein as a binder instead of the resorcinol-benzaldehyde resin and the co-condensation polymerization resin of m- and p-cresols mixture and formaldehyde.

Then, this photosensitive plate was exposed under the same conditions, as above and similarly subjected to development with a 1% aqueous solution of sodium metaslicate, whereby the exposed portion thereof was not completely dissolved. A concentration of the aqueous sodium metasilicate solution was gradually raised and, when it reached 4%, complete development was accomplished under the same conditions as in the above Example 5. Moreover, when development was conducted in the same manner as stated above with the developing solution, which had been previously developed 4 octavo sheets/l. of a commercially available photosensitive lithographic printing plate (corresponding to an approximately 1% aqueous solution of sodium metasilicate), the exposed portion thereof was completely dissolved in case of the polyhydroxyphenyl type plate in the above Example 5. However, when developed similarly with the similar exhausted developer (a 4% aqueous solution of sodium metasilicate), the exposed portion thereof was not completely dissolved in case of the m-cresol-formaldehyde resin type plate. Thereafter, the above two printing plates were compared for chemical resistance. When dipped in a 50% aqueous solution of isopropyl alcohol generally employed for a damping arrangement at room temperature over 60 minutes, loss of the printing area in the printing plate of the above Comparative Example 2 was 50% by weight, whereas the printing plate of the above Example 5 [Sample (5)] showed a loss of 10% by weight. Further, where the above-mentioned two types of printing plates were dipped in an ultra plate cleaner (manufactured by A.B.C. Chemical Co., Ltd.) as another treating chemical at room temperature for 40 minutes, the printing plate of the Comparative Example 2 [Comparative Sample (5)] had the printing portion dissolved to the extent that grain in the aluminum surface may be observed, whereas the printing plate of the Example 5 showed no exposed aluminum surface. When these two printing plates were used for printing in an offset press, the m-cresolformaldehyde resin type printing plate had only ⅔ press life, as compared with that of the Example 5.

COMPARATIVE EXAMPLE 3

A photosensitive lithographic printing plate [Comparative Sample (6)] was prepared by coating in the same manner as described in the above Example 1 with the coating solution having the same composition as described in the above Example 1 except that 3 g. of resorcinol-formaldehyde resin (molecular weight about 2100) was employed in place of 3 g. of the resorcinol-benzaldehyde resin.

Then, this photosensitive plate was exposed under the same conditions as described in the Example 1 and could be rapidly developed with a 1% aqueous solution of sodium metasilicate.

Thereafter, this printing plate was subjected to a ink receptivity test and a printing and chemical resistance test.

When this printing plate was used for printing in an offset press, it had a poor ink receptivity, as compared with that of the Example 1. And so it had double spoilage, and only ⅔ press life, as compared with that of Example 1.

Then, loss of the printing area in the printing plate of the above Comparative Example 2 reached no less than 50% by weight, and so its chemical resistance was inferior to that of the Example 1.

EXAMPLE 6

An aluminum plate with a thickness of 0.24 mm was grained by a nylon brush and anodized and then a photosensitive composition having the following formulation and being dissolved in 100 g. of Methyl cellosolve was coated thereon by means of whirl-coating.

| | |
|---|---|
| Ester of naphthoquinone-1,2-diazide-5-sulfonyl chloride with m-cresol-formaldehyde resin (25 mole % condensation) | 3.5 g. |
| 5-Methylresorcinol-benzaldehyde resin (the Synthesis Example 6) | 4.5 g. |
| m-Cresol-formaldehyde resin (manufactured by Gunei Kagaku K.K., MP-707) | 4.5 g. |
| Ester of naphthoquinone-1,2-diazide-5-sulfonyl chloride with p-octyl-phenol-formaldehyde resin (50 mole % condensation) | 0.15 g. |
| Naphthoquinone-1,2-diazide-4-sulfonyl chloride | 0.15 g. |
| Oil Blue #603 (manufactured by Orient Kagaku Kogyo K.K.) | 0.2 g. |

The coating weight after drying was about 2.7 g./m². The photosensitive lithographic printing plate prepared in this way [Sample (6)] was exposed in the same manner as in the Example 1. Then, the photosensitive plate was developed with a 2% aqueous solution of sodium metasilicate to produce an offset printing plate. Moreover, the above printing plate was tested for chemical resistance under the same conditions as in the Comparative Example 1. After dipping in a 50% aqueous solution of isopropyl alcohol, loss of the printing area was 15% by weight. Even after dipping in an ultra plate cleaner (manufactured by A.B.C. Chemical Co., Ltd.), no exposed aluminum surface was observed. In contrast thereto, when a photosensitive lithographic printing plate [Comparative Sample (7)] was compared having the same formulation as defined above except that only m- and p-cresols-formaldehyde resin (molecular weight 1500) was added as a binder, development could not be effected until a concentration of the aqueous sodium metasilicate solution was raised to 4%. Further, the photosensitive plate according to the Example 6 showed the exposed portion dissolved even if the developer concentration was diluted 3 times (a 0.7% aqueous solution of sodium metasilicate), whereas the m-, p-cresol-formaldehyde resin type photosensitive plate [Comparative Sample (7)] could not be developed even with a 3 times diluted developer (a 1.4% aqueous solution of sodium metasilicate). Also, loss in a 50% aqueous solution of isopropyl alcohol was 45%, the printing urea was dissolved with an ultra plate cleaner (manufactured by A.B.C. Chemical Co., Ltd.) which exposed the aluminum surface. Printing resistance thereof was 3/5 as compared with that of the Example 6.

Moreover, a second comparison was made with a photosensitive lithographic printing plate having the same composition as defined above except that only m-Cresol-formaldehyde resin was added as a binder.

This plate [Comparative Sample (8)] was subjected to the same development test and chemical-resistance test as described in the above Example 6. As a result, development could not be effected until a concentration of the aqueous sodium metasilicate solution was raised to 4%, and when the developer concentration was diluted 3 times (a 1.4% aqueous solution of sodium metasilicate). Also, loss of the printing area with a 50% aqueous solution of isopropyl alcohol was 45% by weight and the printing area was dissolved with the said ultra plate cleaner which exposed the aluminum surface. Press life thereof was ⅔ of that in the above Example 6.

EXAMPLE 7

The same aluminum plate as in the Example 5 was coated with a photosensitive composition having the following formulation and being dissolved in 50 g. of Methyl cellosolve and 50 g. of dimethylformamide was coated thereon by means of whirl-coating.

| | |
|---|---|
| Ester of naphthoquinone-1,2-diazide-5-sulfonyl chloride with pyrogallol-acetone resin (50 mole % condensation) | 3.5 g. |
| Pyrogallol-benzaldehyde resin (the Synthesis Example 8) | 3 g. |
| Co-condensation resin of phenol, m-, p-cresols mixture and formaldehyde (molar ratio of phenol to cresols = 4:6, molecular weight 1500) | 6 g. |
| Ester of naphthoquinone-1,2-diazide-5-sulfonyl chloride with p-octylphenol-formaldehyde resin (50 mole % condensation) | 0.15 g. |
| Naphthoquinone-1,2-diazide-4-sulfonyl chloride | 0.15 g. |
| Crystal Violet | 0.2 g. |

The coating weight after drying was about 2.8 g./m². The photosensitive lithographic printing plate prepared in this way [Sample (7)] was exposed in the same manner as in the above Example 5. Then, when developed with a 2% aqueous solution of sodium metasilicate and the corresponding 0.7% solution, respectively, the exposed portion was completely dissolved in every case. Moreover, loss of the printing area with a 50% aqueous solution of isopropyl alcohol was 20% and no exposed aluminum surface was observed even after dipping in an ultra plate cleaner. In contrast thereto, comparison was made with a photosensitive lithographic printing plate having the same composition as defined above except that only a phenol-formaldehyde resin [Comparative Sample (9)] was added as a binder. The latter plate could not be developed with the same low alkali content developing solution as stated above, loss of the printing area with a 50% aqueous solution of isopropyl alcohol was 40%, the printing area was dissolved with an ultra plate cleaner (manufactured by A.B.C. Chemical Co., Ltd.) which exposed the aluminum surface.

Moreover, a second comparison was made with a photosensitive lithographic printing plate having the same composition as defined above except that only a co-condensation polymerisation resin of phenol, m- and p-cresol mixture and formaldehyde was added as a binder.

This plate [Comparative Sample (10)] was subjected to the same tests described above.

This plate could not be developed with the same low alkali content developing solution as stated above, loss of the printing area with a 50% aqueous solution of isopropyl alcohol was 35% and the printing area was dissolved with the said ultra plate cleaner which also exposed the aluminum surface. And press life thereof was ⅔ of that in the above Example 7.

EXAMPLE 8

The same aluminum plate as in the above Example 5 was coated with a photosensitive composition having the following formulation and being dissolved in 100 g. of Methyl cellosolve was coated thereon by means of whirl-coating.

| | |
|---|---|
| Ester of naphthoquinone-1,2-diazide-5-sulfonyl chloride with m-cresol-formaldehyde resin (25 mole % condensation) | 3.5 g. |
| Resorcinol-4-methylbenzaldehyde resin | 3 g. |
| m-Cresol-formaldehyde resin (manufactured by Gunei Kagaku K.K., MP-707) | 6 g. |
| Ester of naphthoquinone-1,2-diazide-5-sulfonyl chloride with p-octylphenol-formaldehyde resin (50 mole % condensation) | 0.15 g. |
| Naphthoquinone-1,2-diazide-4-sulfonyl chloride | 0.15 g. |
| Patent Pure Blue (manufactured by Sumitomo Mikuni Kagaku K.K.) | 0.2 g. |
| Methyl cellosolve | 100 g. |

The photosensitive lithographic printing plate prepared in this way [Sample (8)] was subjected to the same development test and chemical resistance test as in the Example 6 to give favourable results in which the printing area was hardly dissolved with respect to chemical resistance and the exposed portion was completely dissolved away with respect to development.

EXAMPLE 9

The same aluminum plate as described in the above Example 5 was coated with the coating solution having the following composition.

| | |
|---|---|
| Ester of naphthoquinone-1,2-diazide-5-sulfonyl chloride with m-cresol-formaldehyde resin (25 mole % condensation) as a photosensitive composition | 3.5 g. |
| Co-condensation resin of 2-methyl resorcinol, phenol and acetaldehyde (the Synthesis Example 9) | 6 g. |
| m- and p-cresols-formaldehyde resin (molecular weight 1500) | 3 g. |
| Ester of naphthoquinone-1,2-diazide-5-sulfonyl chloride with p-octylphenol-formaldehyde resin (50 mole % condensation) | 0.15 g. |
| Naphthoquinone-1,2-diazide-4-sulfonyl chloride | 0.15 g. |
| Oil Blue #603 (manufactured by Orient Kagaku Kogyo K.K.) | 0.2 g. |
| Methyl cellosolve | 100 g. |

The photosensitive lithographic printing plate prepared in this way [Sample (9)] was subjected to the same development test and chemical resistance test as described in the Example 6 to give favourable results in which the printing area was hardly dissolved with respect to chemical resistance and the exposed portion was completely dissolved away with respect to development.

EXAMPLE 10

The same aluminum plate as described in the above Example 5 was coated with the coating solution having the following composition.

| | |
|---|---|
| Ester of naphthoquinone-1,2-diazide-5-sulfonyl chloride with m-cresol-formaldehyde resin (25 mole % condensation) as a photosensitive compound | 3.5 g. |
| Co-condensation resin of resorcinol, phenol and benzaldehyde (the Synthesis Example 10) | 6 g. |
| m-Cresol-formaldehyde resin (manufactured by Gunei Kagaku K.K.) | 3 g. |
| Ester of naphthoquinone-1,2-diazide-5-sulfonyl chloride with p-octylphenol-formaldehyde resin (50 mole % condensation) | 0.15 g. |
| Naphthoquinone-1,2-diazide-4-sulfonyl chloride | 0.15 g. |
| Oil Blue #603 (manufactured by Orient Kagaku Kogyo K.K.) | 0.2 g. |
| Methyl cellosolve | 100 g. |

The photosensitive lithographic printing plate prepared in this way [Sample (10)] was subjected to the same development test and chemical resistance test as described in the Example 6 to give favourable results in which the printing area was hardly dissolved with respect to chemical resistance and the exposed portion was completely dissolved away with respect to development.

We claim:

1. A photosensitive composition comprising an admixture of an o-quinonediazide compound and a binder resin having units of the formula

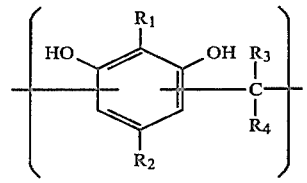

wherein $R_1$ is selected from a hydrogen atom, a hydroxyl group and an alkyl group having 1 to 8 carbon atoms; $R_2$ is selected from a hydrogen atom, a halogen atom, an alkyl group having 1 to 4 carbon atoms and an alkoxy group having 1 to 4 carbon atoms; $R_3$ is selected from a hydrogen atom, an alkyl group having 1 to 4 carbon atoms, an aryl group and a substituted aryl group; and when $R_1$ is selected from a hydrogen atom or a hydroxyl group, then $R_4$ is selected from a phenyl group and a phenyl group substituted with a halogen atom, an alkyl group, an alkoxy group and a nitro group; and when $R_1$ is an alkyl group having 1 to 8 carbon atoms then $R_4$ is selected from a hydrogen atom, a lower alkyl group having 1 to 4 carbon atoms, an aryl group and a substituted aryl group, the amount of said o-quinonediazide compound being between 10 and 50% by weight and the amount of said binder resin being between 1 and 80% by weight based on the total solid content of said photosensitive composition.

2. The photosensitive composition of claim 1 wherein said binder resin is present in an amount of between 1 and 80% by weight based on the total solid content of said photosensitive composition.

3. The photosensitive composition of claim 1 wherein the amount of said binder resin is between 5 and 50% by weight based on the total solid content of said photosensitive composition.

4. The photosensitive composition of claim 1 wherein said o-quinonediazide compound is present in an amount of between 10 and 50% by weight based on the total solid content of said photosensitive composition.

5. The photosensitive composition of claim 1 wherein said units are present in an amount of at least 20% by weight based on the total weight of the photosensitive composition.

6. The photosensitive composition of claim 5 wherein said units are present in an amount of at least 40% by weight based on the total weight of the photosensitive composition.

7. The photosensitive composition of claim 1 wherein said binder resin has a molecular weight of between about 600 and 10,000.

8. The photosensitive composition of claim 7 wherein said binder resin has a molecular weight of between about 800 and 4,000.

9. The photosensitive composition of claim 1 wherein $R_1$ is selected from a hydrogen atom, a methyl group and an ethyl group, and $R_2$ is a methyl group.

10. The photosensitive composition of claim 1 wherein $R_3$ is selected from a methyl group, a phenyl group and a tosyl group and $R_4$ is selected from a hydrogen atom and a methyl group.

11. The photosensitive composition of claim 1 further comprising the presence of at least one other binder resin.

12. The photosensitive composition of claim 11 wherein said other binder resin is selected from a phenol-formaldehyde resin, a cresol-formaldehyde resin and a phenol-cresol-formaldehyde resin.

13. The photosensitive composition of claim 1 wherein $R_3$ is selected from a phenyl group and a phenyl group substituted with an alkyl group having 1 to 4 carbon atoms.

14. The photosensitive composition of claim 1 wherein $R_4$ is selected from a phenyl group and a phenyl group having a substituent selected from an alkyl group having 1 to 4 carbon atoms and an alkoxy group having 1 to 4 carbon atoms.

15. The photosensitive composition of claim 1 further comprising at least one substance selected from a surface active agent, a plasticizer, an acid producing agent in combination with an organic dye, and a silane coupling agent.

16. The photosensitive composition of claim 1 in the form of a coating applied to a photosensitive lithographic printing plate in an amount sufficient to provide a solid content of 0.5 to 3.0 $g/m^2$.

17. The photosensitive composition of claim 1 wherein $R_1$ is selected from a hydrogen atom and a hydroxyl group, $R_2$ is a methyl group, $R_3$ is selected from a methyl group, a phenyl group and a tosyl group, and $R_4$ is selected from a phenyl group and a phenyl group having a substituent selected from a halogen atom, an alkyl group, an alkoxy group and a nitro group, said binder resin being present in an amount between 5 and 50% by weight based on the total solid content of said photosensitive composition.

18. The photosensitive composition of claim 1 wherein $R_1$ is selected from a methyl group and an ethyl group, $R_2$ is a methyl group, $R_3$ is selected from a methyl group, a phenyl group and a tosyl group, and $R_4$ is selected from a hydrogen atom and a methyl group, said binder resin being present in an amount of between 5 and 50% by weight based on the total solid content of said photosensitive composition.

19. The photosensitive composition of claim 17 wherein said binder resin has a molecular weight of between 600 and 10,000.

20. The photosensitive composition of claim 19 wherein said units are present in an amount of at least 40% by weight based on the total weight of the photosensitive composition.

21. The photosensitive composition of claim 18 wherein said binder resin has a molecular weight of between 600 and 10,000.

22. The photosensitive composition of claim 21 wherein said units are present in an amount of at least 40% by weight based on the total weight of the photosensitive composition.

* * * * *